United States Patent
Artmeier et al.

(10) Patent No.: US 12,426,219 B2
(45) Date of Patent: Sep. 23, 2025

(54) INTEGRATION COMPONENT, TEMPERATURE-CONTROL SYSTEM, AND MOTOR VEHICLE

(71) Applicant: Bayerische Motoren Werke Aktiengesellschaft, Munich (DE)

(72) Inventors: Felix Artmeier, Munich (DE); Simon Eglseer, St. Pantaleon-Erla (AT); Alexander Lichtenberger, St. Peter in der Au (AT); Markus Moser, Oberschleissheim (DE); Bjoern Wettlaufer, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 162 days.

(21) Appl. No.: 17/790,793

(22) PCT Filed: Mar. 1, 2021

(86) PCT No.: PCT/EP2021/055011
§ 371 (c)(1),
(2) Date: Jul. 5, 2022

(87) PCT Pub. No.: WO2021/197732
PCT Pub. Date: Oct. 7, 2021

(65) Prior Publication Data
US 2022/0377946 A1    Nov. 24, 2022

(30) Foreign Application Priority Data

Apr. 1, 2020  (DE) ..................... 10 2020 109 071.4

(51) Int. Cl.
*H05K 7/20*   (2006.01)
*B60H 1/14*   (2006.01)
(Continued)

(52) U.S. Cl.
CPC .......... *H05K 7/20872* (2013.01); *B60K 1/00* (2013.01); *B60K 11/02* (2013.01); *B60H 1/143* (2013.01);
(Continued)

(58) Field of Classification Search
CPC ............. B60K 11/02; B60K 2001/005; B60K 2001/006; B60H 1/143; B60H 1/00571;
(Continued)

(56) References Cited

U.S. PATENT DOCUMENTS

| 8,203,839 | B2 * | 6/2012 | Dede ........................ F28F 7/02 361/677 |
| 10,184,735 | B2 * | 1/2019 | Sheppard ................ F28F 27/02 |

(Continued)

FOREIGN PATENT DOCUMENTS

| DE | 10 2011 082 584 A1 | 3/2013 |
| DE | 10 2013 019 298 A1 | 5/2015 |

(Continued)

OTHER PUBLICATIONS

International Search Report (PCT/ISA/210) issued in PCT Application No. PCT/EP2021/055011 dated Jun. 7, 2021 with English translation (four (4) pages).

(Continued)

*Primary Examiner* — Jayprakash N Gandhi
*Assistant Examiner* — Matthew Sinclair Muir
(74) *Attorney, Agent, or Firm* — Crowell & Moring LLP

(57) ABSTRACT

An integration component for a temperature-control system of a motor vehicle, by which component a fluidic circuit is formed, has a finished part for conducting a coolant and at least one fluid element. The finished part has an outer housing; a cooling channel structure which is formed by a network of cavities within the outer housing and is intended for conducting the coolant; cooling channel connections for (Continued)

cooling channels of the cooling channel structure, which connections are formed in one piece with the outer housing and can be coupled to components of the temperature-control system; and at least one receiving portion for the at least one fluid element, wherein the at least one fluid element is located above the receiving portion in order to influence a flow of the coolant in at least one cooling channel of the cooling channel structure.

8 Claims, 2 Drawing Sheets

(51) Int. Cl.
  *B60K 1/00* (2006.01)
  *B60K 11/02* (2006.01)
(52) U.S. Cl.
  CPC .. *B60K 2001/005* (2013.01); *B60K 2001/006* (2013.01)
(58) Field of Classification Search
  CPC ........... H05K 7/20872; H05K 7/20927; H05K 7/20272
  See application file for complete search history.

(56) References Cited

U.S. PATENT DOCUMENTS

| 2013/0061627 | A1 | 3/2013 | Neumeister et al. |
| 2016/0273671 | A1 | 9/2016 | Chang et al. |
| 2017/0218833 | A1 | 8/2017 | Mitteer et al. |
| 2018/0119836 | A1 | 5/2018 | Ozeki et al. |
| 2019/0039440 | A1* | 2/2019 | Calderone ............ B60K 7/0007 |
| 2019/0283542 | A1* | 9/2019 | Spryshak ............. B60H 1/3222 |
| 2020/0259228 | A1* | 8/2020 | Eser .................... H01M 10/625 |
| 2021/0180506 | A1* | 6/2021 | Oh ............................ F01P 5/10 |
| 2022/0194167 | A1* | 6/2022 | Morimoto .......... B60H 1/00571 |

FOREIGN PATENT DOCUMENTS

| DE | 10 2016 118 713 A1 | 4/2018 |
| DE | 10 2017 124 727 A1 | 5/2018 |
| KR | 10-2019-0052283 A | 5/2019 |
| WO | WO 2018/142090 A1 | 8/2018 |
| WO | WO 2019/145575 A1 | 8/2019 |

OTHER PUBLICATIONS

German-language Written Opinion (PCT/ISA/237) issued in PCT Application No. PCT/EP2021/055011 dated Jun. 7, 2021 (five (5) pages).
German-language Office Action issued in German Application No. 10 2020 109 071.4 dated Jan. 31, 2022 (four (4) pages).
German-language Search Report issued in German Application No. 10 2020 109 071.4 dated Dec. 2, 2020 with partial English translation (10 pages).
Chinese-language Office Action issued in Chinese Application No. 202180007815.0 dated Mar. 12, 2025 with English translation (14 pages).

\* cited by examiner

INTEGRATION COMPONENT, TEMPERATURE-CONTROL SYSTEM, AND MOTOR VEHICLE

BACKGROUND AND SUMMARY OF THE INVENTION

The invention relates to an integration component for a temperature-control system of a motor vehicle. The invention furthermore relates to a temperature-control system and a motor vehicle.

In the present case, interest is directed at temperature-control systems for motor vehicles, in particularly electrically drivable motor vehicles, i.e. hybrid vehicles or electric vehicles. Electrically drivable motor vehicles have an electric drivetrain which normally has an electric drive unit with at least one drive machine and a traction battery to supply the electric drive unit. The temperature-control system serves to perform various temperature-control tasks in the motor vehicle, i.e. the supply or discharge of heat from various vehicle components, for example, the traction battery and the drive machine.

Components of the temperature-control system such as valves and water pumps are in this case located according to the potential installation space available in the motor vehicle. These components must be fastened in a partially uncoupled manner to various carriers or holders in the motor vehicle and be connected by way of coolant or refrigerant lines in the form of hoses. The temperature-control systems therefore have a plurality of holders and hoses and, depending on the motor vehicle, a plurality of variants. This results in high mounting outlay and high costs for the temperature-control system.

The object of the present invention is to form a temperature-control system for a motor vehicle in a particularly simple, low-cost and space-saving manner.

This object is achieved by an integration component, a temperature-control system, and a motor vehicle with the features according to the claimed invention.

An integration component according to an embodiment of the invention for a temperature-control system of a motor vehicle, by which component a fluidic circuit is formed, has a finished part for conducting a coolant as well as at least one fluid element. The finished part has an outer housing, a cooling duct structure formed by a cavity network within the outer housing for conducting the coolant and cooling duct connections for cooling ducts of the cooling duct structure which are formed in one piece with the outer housing and which can be coupled to components of the temperature-control system. The finished part furthermore has at least one receptacle for the at least one fluid element, wherein the at least one fluid element is arranged in at least one cooling duct of the cooling duct structure via the receptacle for influencing a flow of the coolant.

An embodiment of the invention furthermore includes a temperature-control system for a motor vehicle with at least two components and with at least one integration component, wherein the at least two components are fluidically coupled to the at least one integration component. The at least two components are, for example, vehicle components in the form of a traction battery and/or an electric drive unit, temperature-control elements in the form of an ambient cooling apparatus and/or a heating apparatus, and/or further fluid elements in the form of a pump and/or a valve. The temperature-control system can have several temperature-control circuits in which a coolant is conveyed as well as at least one cooling circuit in which a refrigerant is conducted. The temperature-control system furthermore has a plurality of fluidic connections or connection elements via which the components are coupled.

The integration component realizes the fluidic circuit which is specified by the respective temperature-control system. The fluidic circuit can fluidically couple several components. The components can be arranged in one temperature-control circuit and/or in different temperature-control circuits. The fluidic circuit has fluidic connections for conducting or transporting the coolant and the at least one fluid element. The fluidic connections are realized by way of the finished part. The finished part is in particular a one-part or one-piece component and is formed in particular as a casting, for example, by injection molding from plastic or pressure casting from metal. The finished part at least partially replaces hose-shaped coolant lines of the temperature-control system which have to be laid in the motor vehicle in a complex manner.

For this purpose, the finished part has the cooling duct structure within which the coolant can be conducted. The cooling duct structure is integrated into the outer housing and is sealed off toward the outside by the outer housing. The cooling duct structure is formed as the cavity network. In other words, a cavity is located in an interior of the outer housing, which cavity is divided by intermediate walls into duct-like coolant lines. Cooling ducts of the cooling duct structure can run in straight lines and/or in an arc-shaped manner and/or have branches, i.e. run in a T-shaped manner and/or Y-shaped manner. The cooling ducts are coupled to duct connections which are formed in the outer housing. The cooling duct connections can be formed, for example, as connecting pieces which can be coupled to the corresponding components of the temperature-control system via hoses of the temperature-control system and/or directly.

The integration component furthermore has the at least one fluid element. The at least one fluid element is a fluidic component which acts on the flow of the coolant within the cooling duct structure. The at least one fluid element is formed in particular as a valve, in particular a shut-off valve, a three-way valve, a switching valve and/or a check valve, and/or a pump. This at least one fluid element is arranged in the at least one receptacle of the finished part. The at least one receptacle is likewise formed in the outer housing and is fluidically coupled to at least one of the cooling ducts of the cooling duct structure so that the fluid element arranged in the receptacle is arranged in the at least one cooling duct and can act on the flow of the coolant in this cooling duct. In the case of a valve, the fluid element can therefore allow or stop the flow only in one direction. In the case of a pump, the fluid element can conduct the coolant.

As a result of the integral design of the at least one fluid element and the fluidic connections in the form of the integration component, the number of hoses and holders can advantageously be at least reduced. The temperature-control system can therefore be formed to be particularly cost-effective.

In one advantageous further development of the invention, the integration component has two temperature-control elements which are arranged on opposite side regions of the finished part and are fastened to the finished part and which are fluidically coupled via at least one cooling duct of the cooling duct structure. In particular, the two temperature-control elements have in each case a coolant side and a refrigerant side, wherein the coolant sides of the two temperature-control elements are fluidically coupled via the cooling duct structure. The two temperature-control elements are preferably formed as a water-cooled condenser and a chiller.

The finished part is therefore located between the two temperature-control elements, wherein the finished part serves both as a holder for the two temperature-control elements and is also fluidically coupled to the temperature-control elements, in particular to their coolant sides. On the refrigerant side, the two temperature-control elements can be coupled to the cooling circuit and thus thermally to one another. For example, the chiller and the condenser can form a heat pump as a result of the coupling so that, in a heat pump mode, heat can be discharged from the temperature-control circuit of the chiller into the temperature-control circuit of the condenser. Due to the fact that the two temperature-control elements are arranged on the finished part, they are and thus their refrigerant sides are arranged spatially particularly close to one another. As a result of this, a connection to the cooling circuit can advantageously be produced by refrigerant hoses with a reduced length. Moreover, a plurality of components of the temperature-control system can be mounted in only one operating step in the motor vehicle as a result of the fastening of the chiller and the condenser to the finished part.

It can be provided in this case that first cooling duct connections which can be coupled to components of the temperature-control system in the form of vehicle components and/or further temperature-control elements and/or further fluid elements are arranged on a front side and a rear side of the finished part and second cooling duct connections which are coupled to the temperature-control elements are arranged on the side regions of the finished part. The finished part can therefore be flowed through both in a longitudinal direction extending between the side regions and in a transverse direction extending between the front side and the rear side. The cooling ducts can therefore be oriented within the outer housing along the longitudinal direction, the transverse direction and/or along a vertical direction extending between an upper side and a lower side. The at least one receptacle for the at least one fluid element can be formed, for example, on the upper side and/or the front side and/or the rear side of the finished part.

The invention furthermore relates to a motor vehicle with a temperature-control system according to an embodiment of the invention. The motor vehicle is formed in particular as an electrically drivable motor vehicle.

The embodiments presented in relation to the integration component according to the invention and the advantages thereof correspondingly apply to the temperature-control system according to the invention as well as to the motor vehicle according to the invention.

Further features of the invention arise from the claims, the figures and the description of the figures. The features stated above in the description and combinations of features as well as the features stated below in the description of the figures and/or shown solely in the figures and combinations of features can be used not only in the respectively indicated combination, but also in other combinations or on their own.

The invention will now be explained in greater detail on the basis of a preferred exemplary embodiment and with reference to the drawings.

DETAILED DESCRIPTION OF THE DRAWINGS

Identical elements and elements with identical functions are provided with the same reference numbers in the figures.

Figure 1:
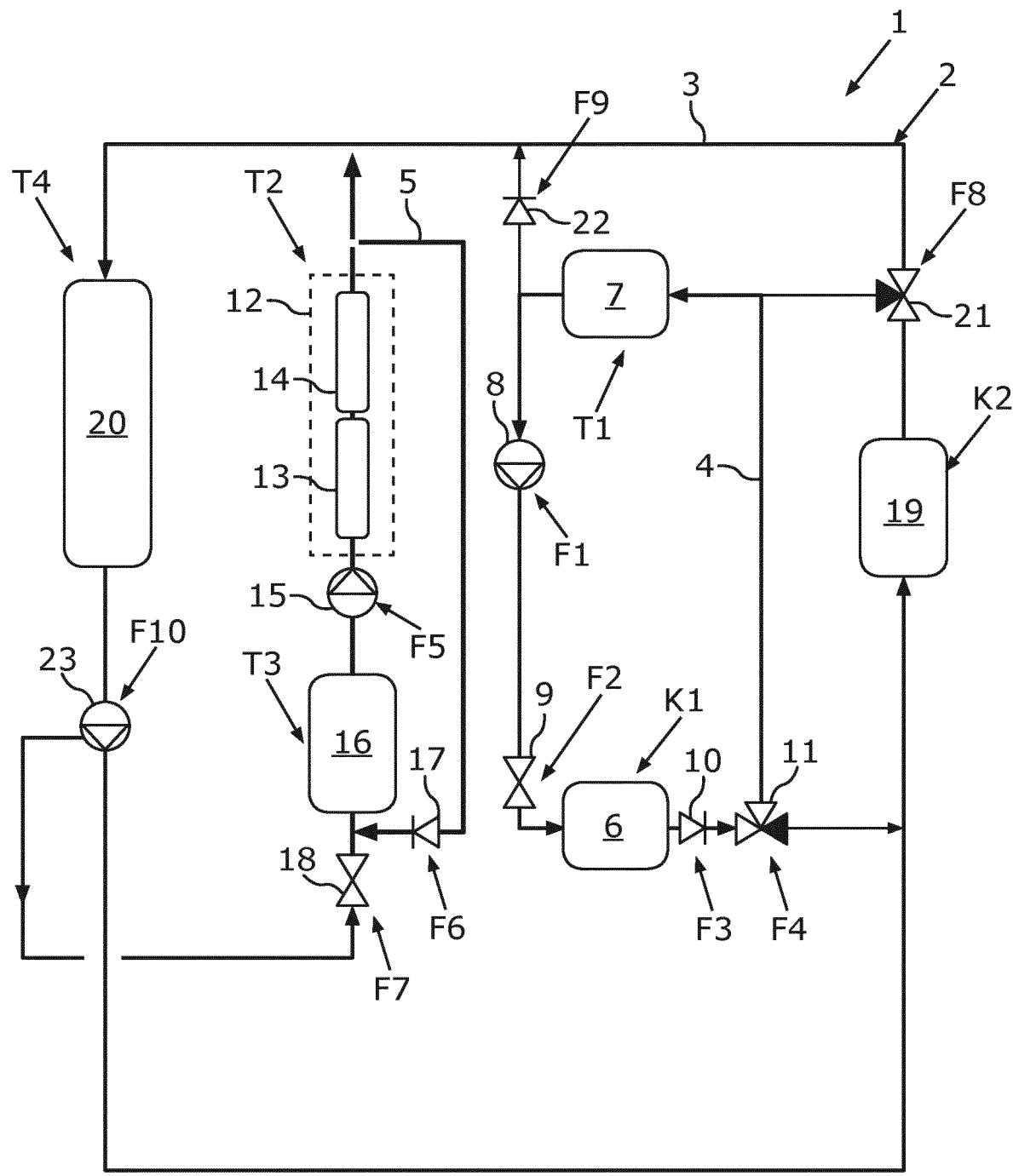
FIG. 1 shows a schematic representation of a temperature-control system for a motor vehicle.

FIG. 1 shows a temperature-control system 1 for a, in particular electrically drivable, motor vehicle. Here, an overall temperature-control circuit 2 of temperature-control system 1 is shown which conducts a coolant and can be thermally coupled to a cooling circuit, which is not shown here and conducts refrigerant, of temperature-control system 1. Overall temperature-control circuit 2 has here several temperature-control circuits 3, 4, 5 in the form of an ambient cooling circuit 3, a HVS circuit 4 and a heating circuit 5. HVS circuit 4 has a first vehicle component K1 in the form of a traction battery 6 of the motor vehicle and a first temperature-control element T1 in the form of a chiller 7 for cooling traction battery 6. Chiller 7 is in particular connected to the cooling circuit, not shown here. HVS circuit 4 furthermore has here a first fluid element F1 in the form of a pump 8 for the circulation of coolant, a second fluid element F2 in the form of a shut-off valve 9 upstream of traction battery 6 as well as a third fluid element F3 in the form of a check valve 10 downstream of traction battery 6. Shut-off valve 9 and check valve 10 fluidically encapsulate traction battery 6. HVS circuit 4 furthermore has a fourth fluid element F4 in the form of a three-way valve 11 via which HVS circuit 4 can be connected to ambient cooling circuit 3.

Heating circuit 5 which is formed to air-condition an interior of the motor vehicle has a second temperature-control element T2 in the form of a heating apparatus 12 which is formed to heat interior air of the motor vehicle. Heating apparatus 12 has here a heating heat exchanger 13 and an auxiliary heater 14. Heating heat exchanger 13 can furthermore discharge heat from the interior in order to cool the interior. Auxiliary heater 14 can be formed, for example, as an electric flow heater. Heating circuit 5 furthermore has a fifth fluid element F5 in the form of a pump 15 and a third temperature-control element T3 in the form of a, for example, water-cooled, condenser (WCC) 16. Condenser 16 is thermally coupled via the cooling circuit to chiller 7 of HVS circuit 4 and form jointly with chiller 7 a heat pump. In heat pump operation, the heat pump is formed to transfer heat from HVS circuit 4 into heating circuit 5. Heating circuit 5 furthermore has a sixth fluid element F6 in the form of a check valve 17. Heating circuit 5 can be fluidically coupled to ambient cooling circuit 3 via a seventh fluid element F7 in the form of a shut-off valve 18.

Ambient cooling circuit 3 has a second vehicle component K2 in the form of an electric drive unit 19. Electric drive unit 19 has, for example, at least one electric drive machine as well as power electronics. Ambient cooling circuit 3 furthermore has a fourth temperature-control element T4 in the form of an ambient cooler apparatus 20 for heat exchange with the surroundings of the motor vehicle. Electric drive unit 19 can be cooled via ambient cooling apparatus 20. Moreover, ambient cooling circuit 3 has an eighth fluid element F8 in the form of a three-way valve 21 via which coolant can be fed from ambient cooling circuit 3 into HVS circuit 4. This coolant then flows from electric drive unit 19 via chiller 7 as well as a ninth fluid element F9 in the form of a check valve 22 back into ambient cooling circuit 3 and from there to ambient cooling apparatus 20. Ambient cooling circuit 3 furthermore has a tenth fluid element F10 in the form of a pump 23 for conveying the coolant in ambient cooling circuit 3.

Figure 2:
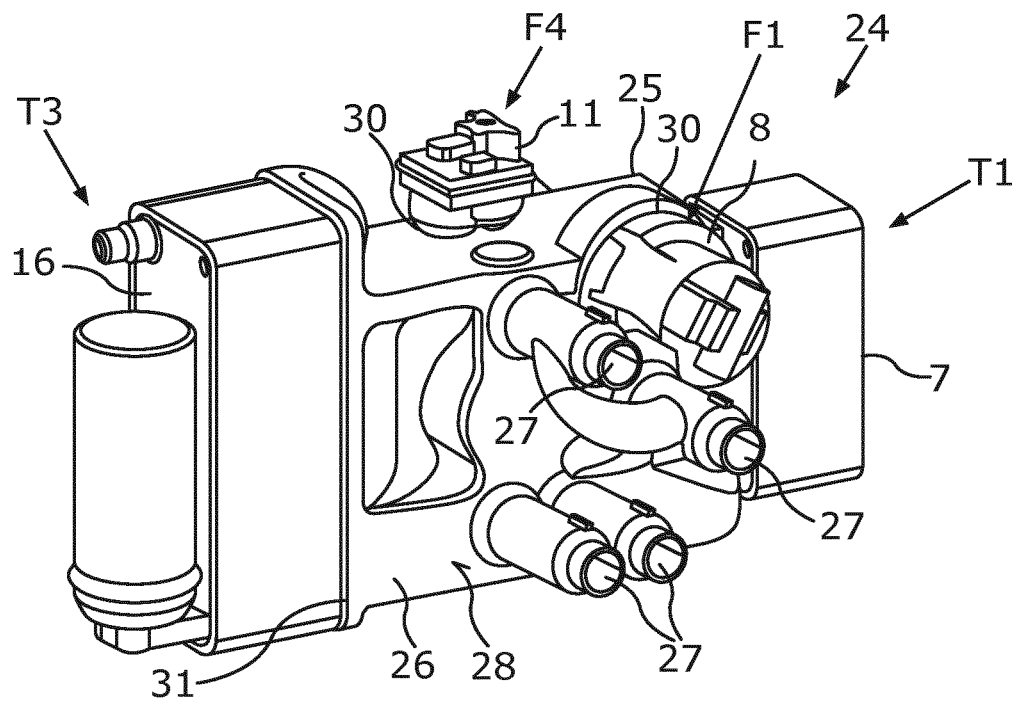
FIG. 2 shows a schematic representation of an integration component of the temperature-control system from a first perspective.
Figure 3:
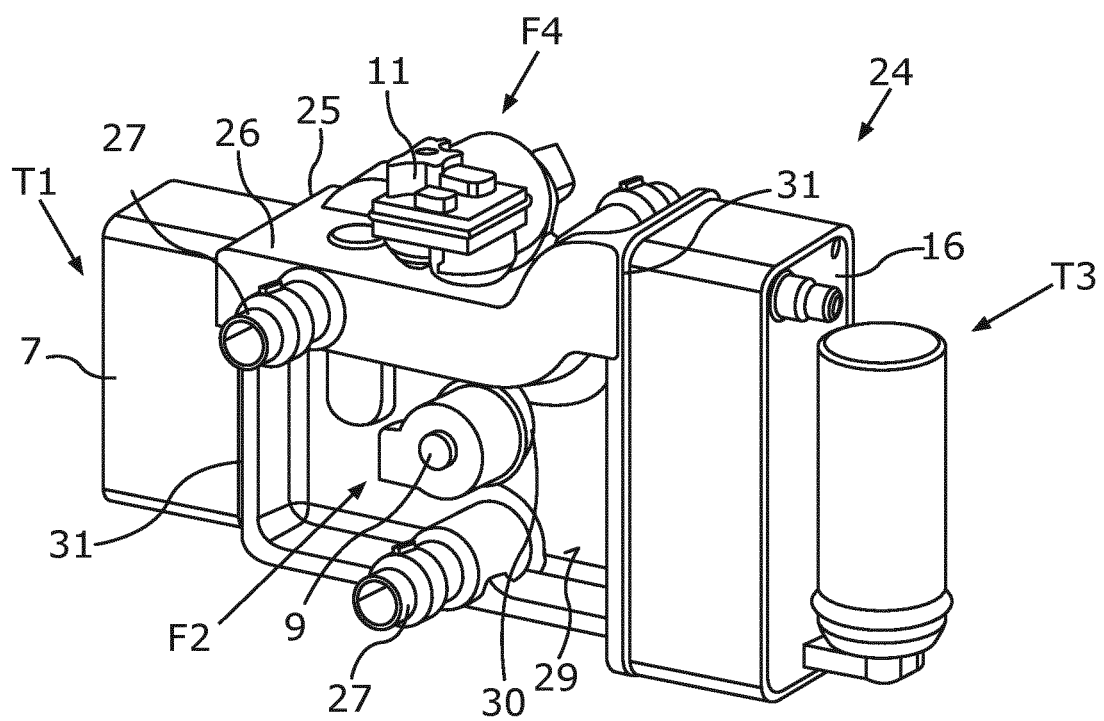
FIG. 3 shows a schematic representation of an integration component of the temperature-control system from a second perspective.

Temperature-control system 1 therefore has a plurality of components, for example, vehicle components K1, K2, temperature-control elements T1, T2, T3, T4 as well as fluid elements F1 to F10 which must be fluidically interconnected. In order to reduce the number and length of fluidic connections in the form of hoses, temperature-control system 1 has an integration component 24 which is shown in FIG. 2 and FIG. 3 from different perspectives. Fluid elements F1 to F10, temperature-control elements T1 to T4 as well as fluidic connections are at least partially combined in integration component 24. A fluidic circuit is therefore realized by integration component 24. Here, temperature-control elements T1 and T3 in the form of chiller 7 and condenser 16 as well as fluid elements F1, F2 and F4 in the form of pump 8, shut-off valve 9 and three-way valve 11 are combined in integration component 24.

Integration component 24 has a finished part 25 which is formed, for example, as a casting. The casting can be produced, for example, by injection molding from plastic or pressure die-casting from a metal, for example, aluminum. Finished part 25 has an outer housing 26, in the interior of which a cooling duct structure is formed. The cooling duct structure forms the fluidic connection elements and is formed by a cavity network in the interior of outer housing 26. Cooling duct connections 27 are formed in one part with outer housing 26, which cooling duct connections 27 are arranged here on a front side 28 and a rear side 29 of outer housing 26. Cooling duct connections 27 are formed here as connecting pieces. Cooling duct connections 27 on front side 28 can be coupled, for example, to drive unit 19 and ambient cooling apparatus 20 and cooling duct connections 27 on rear side 29 can be coupled, for example, to traction battery 6. Cooling ducts of the cooling duct network are in this case branched within outer housing 26 in such a manner that the fluidic interconnection of temperature-control elements T1 and T3 and fluid elements F1, F2 and F4 of temperature-control system 1 according to FIG. 1 is produced.

Fluid elements F1, F2, F4 are arranged here in receptacles 30 of finished part 25, which receptacles are integrated into outer housing 26. Receptacles 30 can be, for example, openings in outer housing 25 and/or depressions in outer housing 25 which are opened on the side of the cooling duct structure so that corresponding fluid element F1, F2, F4 can act on the flow of the coolant in the respective cooling duct of the cooling duct network. Fluid elements F1, F2, F4 are inserted into receptacles 30 and fastened there.

Temperature-control elements T1 and T3 are arranged on opposite side regions 31 of finished part 25. A coolant side of temperature-control elements T1, T3 is fluidically coupled to cooling ducts of the cooling duct structure in the interior of outer housing 26. For example, chiller 7 can be coupled to a cooling duct of the cooling duct structure, in which cooling duct fluid elements F1 and F2, therefore pump 8 and shut-off valve 9, are arranged and which is connected to cooling duct connection 27 for coupling to traction battery 6. Temperature-control elements T1, T3 are fastened to finished part 25 so that integration component 24 can be mounted in an operating step in the motor vehicle.

The invention relates to an integration component for a temperature-control system of a motor vehicle. The invention furthermore relates to a temperature-control system and a motor vehicle.

In the present case, interest is directed at temperature-control systems for motor vehicles, in particularly electrically drivable motor vehicles, i.e. hybrid vehicles or electric vehicles. Electrically drivable motor vehicles have an electric drivetrain which normally has an electric drive unit with at least one drive machine and a traction battery to supply the electric drive unit. The temperature-control system serves to perform various temperature-control tasks in the motor vehicle, i.e. the supply or discharge of heat from various vehicle components, for example, the traction battery and the drive machine.

Components of the temperature-control system such as valves and water pumps are in this case located according to the potential installation space available in the motor vehicle. These components must be fastened in a partially uncoupled manner to various carriers or holders in the motor vehicle and be connected by means of coolant or refrigerant lines in the form of hoses. The temperature-control systems therefore have a plurality of holders and hoses and, depending on the motor vehicle, a plurality of variants. This results in high mounting outlay and high costs for the temperature-control system.

The object of the present invention is to form a temperature-control system for a motor vehicle in a particularly simple, low-cost and space-saving manner.

This object is achieved according to the invention by an integration component, a temperature-control system as well as a motor vehicle with the features according to the respective independent claims. Advantageous embodiments of the invention are the subject matter of the dependent claims, the description and the figures.

An integration component according to the invention for a temperature-control system of a motor vehicle, by which component a fluidic circuit is formed, has a finished part for conducting a coolant as well as at least one fluid element. The finished part has an outer housing, a cooling duct structure formed by a cavity network within the outer housing for conducting the coolant and cooling duct connections for cooling ducts of the cooling duct structure which are formed in one piece with the outer housing and which can be coupled to components of the temperature-control system. The finished part furthermore has at least one receptacle for the at least one fluid element, wherein the at least one fluid element is arranged in at least one cooling duct of the cooling duct structure via the receptacle for influencing a flow of the coolant.

The invention furthermore includes a temperature-control system for a motor vehicle with at least two components and with at least one integration component according to the invention, wherein the at least two components are fluidically coupled to the at least one integration component. The at least two components are, for example, vehicle components in the form of a traction battery and/or an electric drive unit, temperature-control elements in the form of an ambient cooling apparatus and/or a heating apparatus, and/or further fluid elements in the form of a pump and/or a valve. The temperature-control system can have several temperature-control circuits in which a coolant is conveyed as well as at least one cooling circuit in which a refrigerant is conducted. The temperature-control system furthermore has a plurality of fluidic connections or connection elements via which the components are coupled.

The integration component realizes the fluidic circuit which is specified by the respective temperature-control system. The fluidic circuit can fluidically couple several components. The components can be arranged in one temperature-control circuit and/or in different temperature-control circuits. The fluidic circuit has fluidic connections for conducting or transporting the coolant and the at least one fluid element. The fluidic connections are realized by means of the finished part. The finished part is in particular a one-part or one-piece component and is formed in particular as a casting, for example, by injection molding from plastic or pressure casting from metal. The finished part at least partially replaces hose-shaped coolant lines of the temperature-control system which have to be laid in the motor vehicle in a complex manner.

For this purpose, the finished part has the cooling duct structure within which the coolant can be conducted. The cooling duct structure is integrated into the outer housing and is sealed off toward the outside by the outer housing. The cooling duct structure is formed as the cavity network. In other words, a cavity is located in an interior of the outer housing, which cavity is divided by intermediate walls into duct-like coolant lines. Cooling ducts of the cooling duct structure can run in straight lines and/or in an arc-shaped manner and/or have branches, i.e. run in a T-shaped manner and/or Y-shaped manner. The cooling ducts are coupled to duct connections which are formed in the outer housing. The cooling duct connections can be formed, for example, as connecting pieces which can be coupled to the corresponding components of the temperature-control system via hoses of the temperature-control system and/or directly.

The integration component furthermore has the at least one fluid element. The at least one fluid element is a fluidic component which acts on the flow of the coolant within the cooling duct structure. The at least one fluid element is formed in particular as a valve, in particular a shut-off valve, a three-way valve, a switching valve and/or a check valve, and/or a pump. This at least one fluid element is arranged in the at least one receptacle of the finished part. The at least one receptacle is likewise formed in the outer housing and is fluidically coupled to at least one of the cooling ducts of the cooling duct structure so that the fluid element arranged in the receptacle is arranged in the at least one cooling duct and can act on the flow of the coolant in this cooling duct. In the case of a valve, the fluid element can therefore allow or stop the flow only in one direction. In the case of a pump, the fluid element can conduct the coolant.

As a result of the integral design of the at least one fluid element and the fluidic connections in the form of the integration component, the number of hoses and holders can advantageously be at least reduced. The temperature-control system can therefore be formed to be particularly cost-effective.

In one advantageous further development of the invention, the integration component has two temperature-control elements which are arranged on opposite side regions of the finished part and are fastened to the finished part and which are fluidically coupled via at least one cooling duct of the cooling duct structure. In particular, the two temperature-control elements have in each case a coolant side and a refrigerant side, wherein the coolant sides of the two temperature-control elements are fluidically coupled via the cooling duct structure. The two temperature-control elements are preferably formed as a water-cooled condenser and a chiller.

The finished part is therefore located between the two temperature-control elements, wherein the finished part serves both as a holder for the two temperature-control elements and is also fluidically coupled to the temperature-control elements, in particular to their coolant sides. On the refrigerant side, the two temperature-control elements can be coupled to the cooling circuit and thus thermally to one another. For example, the chiller and the condenser can form a heat pump as a result of the coupling so that, in a heat pump mode, heat can be discharged from the temperature-control circuit of the chiller into the temperature-control circuit of the condenser. Due to the fact that the two temperature-control elements are arranged on the finished part, they are and thus their refrigerant sides are arranged spatially particularly close to one another. As a result of this, a connection to the cooling circuit can advantageously be produced by refrigerant hoses with a reduced length. Moreover, a plurality of components of the temperature-control system can be mounted in only one operating step in the motor vehicle as a result of the fastening of the chiller and the condenser to the finished part.

It can be provided in this case that first cooling duct connections which can be coupled to components of the temperature-control system in the form of vehicle components and/or further temperature-control elements and/or further fluid elements are arranged on a front side and a rear side of the finished part and second cooling duct connections which are coupled to the temperature-control elements are arranged on the side regions of the finished part. The finished part can therefore be flowed through both in a longitudinal direction extending between the side regions and in a transverse direction extending between the front side and the rear side. The cooling ducts can therefore be oriented within the outer housing along the longitudinal direction, the transverse direction and/or along a vertical direction extending between an upper side and a lower side. The at least one receptacle for the at least one fluid element can be formed, for example, on the upper side and/or the front side and/or the rear side of the finished part.

The invention furthermore relates to a motor vehicle with a temperature-control system according to the invention. The motor vehicle is formed in particular as an electrically drivable motor vehicle.

The embodiments presented in relation to the integration component according to the invention and the advantages thereof correspondingly apply to the temperature-control system according to the invention as well as to the motor vehicle according to the invention.

Further features of the invention arise from the claims, the figures and the description of the figures. The features stated above in the description and combinations of features as well as the features stated below in the description of the figures and/or shown solely in the figures and combinations of features can be used not only in the respectively indicated combination, but also in other combinations or on their own.

The invention will now be explained in greater detail on the basis of a preferred exemplary embodiment and with reference to the drawings. In the drawings:

FIG. 1 shows a schematic representation of a temperature-control system for a motor vehicle;

FIG. 2 shows a schematic representation of an integration component of the temperature-control system from a first perspective; and FIG. 3 shows a schematic representation of an integration component of the temperature-control system from a second perspective.

Identical elements and elements with identical functions are provided with the same reference numbers in the figures.

FIG. 1 shows a temperature-control system 1 for a, in particular electrically drivable, motor vehicle. Here, an overall temperature-control circuit 2 of temperature-control system 1 is shown which conducts a coolant and can be thermally coupled to a cooling circuit, which is not shown here and conducts refrigerant, of temperature-control system 1. Overall temperature-control circuit 2 has here several temperature-control circuits 3, 4, 5 in the form of an ambient cooling circuit 3, a HVS circuit 4 and a heating circuit 5. HVS circuit 4 has a first vehicle component K1 in the form of a traction battery 6 of the motor vehicle and a first temperature-control element T1 in the form of a chiller 7 for cooling traction battery 6. Chiller 7 is in particular connected to the cooling circuit, not shown here. HVS circuit 4 furthermore has here a first fluid element F1 in the form of a pump 8 for the circulation of coolant, a second fluid element F2 in the form of a shut-off valve 9 upstream of traction battery 6 as well as a third fluid element F3 in the form of a check valve 10 downstream of traction battery 6. Shut-off valve 9 and check valve 10 fluidically encapsulate traction battery 6. HVS circuit 4 furthermore has a fourth fluid element F4 in the form of a three-way valve 11 via which HVS circuit 4 can be connected to ambient cooling circuit 3.

Heating circuit 5 which is formed to air-condition an interior of the motor vehicle has a second temperature-control element T2 in the form of a heating apparatus 12 which is formed to heat interior air of the motor vehicle. Heating apparatus 12 has here a heating heat exchanger 13 and an auxiliary heater 14. Heating heat exchanger 13 can furthermore discharge heat from the interior in order to cool the interior. Auxiliary heater 14 can be formed, for example, as an electric flow heater. Heating circuit 5 furthermore has a fifth fluid element F5 in the form of a pump 15 and a third temperature-control element T3 in the form of a, for example, water-cooled, condenser (WCC) 16. Condenser 16 is thermally coupled via the cooling circuit to chiller 7 of HVS circuit 4 and form jointly with chiller 7 a heat pump. In heat pump operation, the heat pump is formed to transfer heat from HVS circuit 4 into heating circuit 5. Heating circuit 5 furthermore has a sixth fluid element F6 in the form of a check valve 17. Heating circuit 5 can be fluidically coupled to ambient cooling circuit 3 via a seventh fluid element F7 in the form of a shut-off valve 18.

Ambient cooling circuit 3 has a second vehicle component K2 in the form of an electric drive unit 19. Electric drive unit 19 has, for example, at least one electric drive machine as well as power electronics. Ambient cooling circuit 3 furthermore has a fourth temperature-control element T4 in the form of an ambient cooler apparatus 20 for heat exchange with the surroundings of the motor vehicle. Electric drive unit 19 can be cooled via ambient cooling apparatus 20. Moreover, ambient cooling circuit 3 has an eighth fluid element F8 in the form of a three-way valve 21 via which coolant can be fed from ambient cooling circuit 3 into HVS circuit 4. This coolant then flows from electric drive unit 19 via chiller 7 as well as a ninth fluid element F9 in the form of a check valve 22 back into ambient cooling circuit 3 and from there to ambient cooling apparatus 20. Ambient cooling circuit 3 furthermore has a tenth fluid element F10 in the form of a pump 23 for conveying the coolant in ambient cooling circuit 3.

Temperature-control system 1 therefore has a plurality of components, for example, vehicle components K1, K2, temperature-control elements T1, T2, T3, T4 as well as fluid elements F1 to F10 which must be fluidically interconnected. In order to reduce the number and length of fluidic connections in the form of hoses, temperature-control system 1 has an integration component 24 which is shown in FIG. 2 and FIG. 3 from different perspectives. Fluid elements F1 to F10, temperature-control elements T1 to T4 as well as fluidic connections are at least partially combined in integration component 24. A fluidic circuit is therefore realized by integration component 24. Here, temperature-control elements T1 and T3 in the form of chiller 7 and condenser 16 as well as fluid elements F1, F2 and F4 in the form of pump 8, shut-off valve 9 and three-way valve 11 are combined in integration component 24.

Integration component 24 has a finished part 25 which is formed, for example, as a casting. The casting can be produced, for example, by injection molding from plastic or pressure die-casting from a metal, for example, aluminum. Finished part 25 has an outer housing 26, in the interior of which a cooling duct structure is formed. The cooling duct structure forms the fluidic connection elements and is formed by a cavity network in the interior of outer housing 26. Cooling duct connections 27 are formed in one part with outer housing 26, which cooling duct connections 27 are arranged here on a front side 28 and a rear side 29 of outer housing 26. Cooling duct connections 27 are formed here as connecting pieces. Cooling duct connections 27 on front side 28 can be coupled, for example, to drive unit 19 and ambient cooling apparatus 20 and cooling duct connections 27 on rear side 29 can be coupled, for example, to traction battery 6. Cooling ducts of the cooling duct network are in this case branched within outer housing 26 in such a manner that the fluidic interconnection of temperature-control elements T1 and T3 and fluid elements F1, F2 and F4 of temperature-control system 1 according to FIG. 1 is produced.

Fluid elements F1, F2, F4 are arranged here in receptacles 30 of finished part 25, which receptacles are integrated into outer housing 26. Receptacles 30 can be, for example, openings in outer housing 25 and/or depressions in outer housing 25 which are opened on the side of the cooling duct structure so that corresponding fluid element F1, F2, F4 can act on the flow of the coolant in the respective cooling duct of the cooling duct network. Fluid elements F1, F2, F4 are inserted into receptacles 30 and fastened there.

Temperature-control elements T1 and T3 are arranged on opposite side regions 31 of finished part 25. A coolant side of temperature-control elements T1, T3 is fluidically coupled to cooling ducts of the cooling duct structure in the interior of outer housing 26. For example, chiller 7 can be coupled to a cooling duct of the cooling duct structure, in which cooling duct fluid elements F1 and F2, therefore pump 8 and shut-off valve 9, are arranged and which is connected to cooling duct connection 27 for coupling to traction battery 6. Temperature-control elements T1, T3 are fastened to finished part 25 so that integration component 24 can be mounted in an operating step in the motor vehicle.

What is claimed is:
1. An integration component for a temperature-control system of a motor vehicle, wherein the integration component forms a fluidic circuit, the integration component comprising:
a finished part for conducting a coolant and a fluid element, wherein the finished part comprises:
an outer housing,
a cooling duct structure formed by a cavity network within the outer housing for conducting the coolant, cooling duct connections for cooling ducts of the cooling duct structure which are formed in one piece with the outer housing and which are coupleable to components of the temperature-control system, two temperature-control elements which are arranged on opposite side regions of the finished part, are fastened to the finished part, and are fluidically coupled via at least one cooling duct of the cooling duct structure, and a receptacle for the fluid element, wherein the receptacle is at least one of an opening in the outer housing or a depression in the outer housing, wherein the fluid element is inserted into the receptacle and fastened to the receptacle, wherein the fluid element is arranged in a cooling duct of the cooling duct structure via the receptacle for influencing a flow of the coolant, wherein the finished part is located between the two temperature-control elements, and wherein each of the two temperature-control elements has a coolant side and a refrigerant side, and the coolant sides of the two temperature-control elements are fluidically coupled via the cooling duct structure.

2. The integration component according to claim 1, wherein the finished part is formed as a casting.

3. The integration component according to claim 1, wherein the fluid element is formed as at least one of a valve or a pump.

4. The integration component according to claim 1, wherein the two temperature-control elements are formed as a water-cooled condenser and a chiller.

5. The integration component according to claim 1, wherein:
   first cooling duct connections which are coupleable to components of the temperature-control system in a form of at least one of vehicle components, further temperature-control elements, or further fluid elements are arranged on a front side and a rear side of the finished part, and
   second cooling duct connections which are coupled to the temperature-control elements are arranged on the side regions of the finished part.

6. A temperature-control system for a motor vehicle, the temperature-control system comprising:
   at least two components, and
   at least one integration component according to claim 1,
   wherein the at least two components are fluidically coupled to the at least one integration component.

7. The temperature-control system according to claim 6, wherein the at least two components comprise at least two of the following:
   vehicle components in a form of at least one of a traction battery or an electric drive unit,
   temperature-control elements in a form of at least one of an ambient cooling apparatus or a heating apparatus, and
   further fluid elements in a form of at least one of a pump or a valve.

8. A motor vehicle comprising the temperature-control system according to claim 6.

* * * * *